(12) United States Patent
Heady

(10) Patent No.: US 7,161,803 B1
(45) Date of Patent: Jan. 9, 2007

(54) COOLING SYSTEM FOR AN ELECTRONIC DISPLAY

(76) Inventor: Gregory S. Heady, 21565 N. 78th St., Scottsdale, AZ (US) 85255

( * ) Notice: Subject to any disclaimer, the term of this patent is extended or adjusted under 35 U.S.C. 154(b) by 280 days.

(21) Appl. No.: 10/823,477

(22) Filed: Apr. 12, 2004

(51) Int. Cl.
*H05K 7/20* (2006.01)
(52) U.S. Cl. .................. 361/700; 165/80.5; 165/104.33
(58) Field of Classification Search ................ 361/700, 361/698–699; 165/80.4–80.5, 122, 185; 313/22, 35; 348/748; 349/58, 161
See application file for complete search history.

(56) References Cited

U.S. PATENT DOCUMENTS

| | | | | |
|---|---|---|---|---|
| 4,987,749 | A * | 1/1991 | Baier ........................... | 62/222 |
| 5,991,153 | A | 11/1999 | Heady et al. | |
| 6,369,793 | B1 * | 4/2002 | Parker ......................... | 345/107 |
| 6,938,432 | B1 * | 9/2005 | Enomoto ...................... | 62/217 |
| 2002/0108744 | A1 * | 8/2002 | Bowman et al. ............ | 165/185 |
| 2004/0001310 | A1 * | 1/2004 | Chu et al. .................... | 361/687 |
| 2005/0111183 | A1 * | 5/2005 | Pokharna et al. ........... | 361/687 |

* cited by examiner

*Primary Examiner*—Michael Datskovsky
*Assistant Examiner*—Robert J. Hoffberg
(74) *Attorney, Agent, or Firm*—Schmeiser, Olsen & Watts LLP

(57) ABSTRACT

A cooling system for an electronic display may include a heat collector plate with internal gas and liquid phase lines. The cooling plate may be thermally isolated together with electronic components of the display within an enclosure of the display, while external lines carry liquid and gas phase refrigerant outside the enclosure to and from the heat collector plate. The external lines may be similar in size to each other and may be connected to the heat collector outside the heat collector plate by a manifold. The heat collector plate contacts a base plate of the electronic display in a thermally conductive relation to transfer heat from electronic components within the display to the gas phase refrigerant. Fans may be included for additional convective heat transfer. A single compressor may be fluidly connected to multiple heat collector plates in respective electronic displays.

32 Claims, 9 Drawing Sheets

COOLING SYSTEM FOR AN ELECTRONIC DISPLAY

BACKGROUND OF THE INVENTION

1. Technical Field

This invention generally relates to heat collector systems, and in particular to heat collector systems for electronic displays.

2. State of the Art

The prior art predominately includes convective heat transfer systems for electronic displays. These systems of the past generally attempt to remove heat from the electronic components in a display through as many sidewalls of the display as possible. In order to do this, the systems of the past have incorporated fans for moving air past the components to be cooled and out of the display. In some cases, the heated air is moved into convectively thermal communication with fins. Some of the past systems have also utilized conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays have called for greater cooling capabilities.

DISCLOSURE OF THE INVENTION

The present invention relates to a heat collector plate and cooling system for an electronic display. This invention has many features that are different from those of Applicant's own disclosure in U.S. Pat. No. 5,991,153, issued to Gregory S. Heady et al. Nov. 23, 1999 and entitled "Heat Transfer System for an Electronic Display", the disclosure of which is incorporated herein in its entirety. However, much of the disclosure of U.S. Pat. No. 5,991,153 provides a background for the improvements of the present invention. Furthermore, the features of the present invention in combination with those of the Applicant's prior patent represent significant and advantageous advances in the art that were not obvious at the time of this invention.

The present invention also has many features that are useable together with the inventions disclosed in Applicant's own disclosure in U.S. patent application Ser. No. 10/823, 476, filed Apr. 12, 2004 and entitled "Heat Collector Plate for an Electronic Display", the disclosure of which is incorporated herein in its entirety.

In particular, cooling devices for electronic displays of the past have generally used convective heat dissipation systems that function to cool an entire interior of the display by one or more fans and fins, for example. This is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated, and more heat will be transmitted into the displays. In the past, many displays have functioned satisfactorily with ten or twelve inch screens. Now, many displays are in need of screens having sizes greater than or equal to twelve inches that may require improved cooling systems. For example, some applications call for fifteen inch screens. With increased heat production with the fifteen inch screens and radiative heat transfer from the sun through the display window, heat dissipation systems of the past, (which attempt to cool the entire interior of the display with fins and fans), are no longer adequate.

By the aspects to be described below, the present invention has made consistent cooling possible for electronic displays having screens of sizes greater than or equal to twelve inches. For example, cooling of a fifteen inch screen can be achieved, even in extremely hot climates. The present invention implements insulative materials, improved contact between elements for increased conductive heat transfer, and a two phase refrigerant in conjunction with isolating a volume to be cooled from the compressor and the ambient conditions external to the volume.

In particular, separating the compressor from the electronics has some important advantages. One advantage is that doing so physically separates the heat creating compressor and associated fins from the electronics that the system is trying to cool. Therefore the present invention lessens the opportunity for the heat from the compressor to be returned to the electronic components. Another advantage is that isolation of the compressor from the electronics permits the present invention to be used in applications that have restrictions on how close certain components may be placed to the displays. For example, refrigerant type cooling systems would typically not be approved for gasoline display pumps because of the fire hazards associated with the contactors that switch the cooling system on and off. However, with the present invention, the compressor and associated components can be isolated from a gasoline pump and display. In fact, ideally, a large compressor may be isolated in a canopy or roof. A regulator may control flow through a plurality of lines communicating between the compressor and a corresponding plurality of pumps. Thus, the present invention advantageously opens possibilities of providing effective cooling in gasoline pump displays and other applications.

Convective heat transfer cooling systems of the past used in conjunction with electronic components has the disadvantage of pulling dust in from outside and placing the dust in contact with the components. These components inherently have electrostatically attractive charges, and essentially act as an electrostatic filter that collects the dust. Hence, function and life of the components may be compromised.

A large fluctuation in temperature is common in the non refrigerant cooled devices of the past. Such temperature fluctuation adversely affects the electronic components in these devices. For example, with a 10 degree average temperature fluctuation from a standard 22 degrees C., the life expectancy of a light emitting diode (LED) screen will be cut in half. Thus, with the non refrigerant cooling systems of the past, the life expectancy of an (LED) screen is approximately 18 months. Advantageously, it is believed that the present invention will permit improvement of the life expectancy to a range from approximately 5 years to approximately 7 years.

While sealing off a volume in which the electronic components reside may seem counterintuitive in light of the past convective cooling systems, sealing the volume surrounding the electronics has the advantages of reducing the amount of dust that will collect on the components. Furthermore, sealing a smaller volume that more tightly encloses the electronic components reduces the volume or mass that needs to be maintained at a cool temperature. While electronic displays having screens between ten to twelve inches could be cooled to a degree with the convective heat transfer cooling systems of the past, many screens of sizes greater than or equal to approximately twelve inches require improved cooling capabilities such as those of the present invention. In particular, many applications call for fifteen inch screens. With increased heat production with the screens of larger sizes and radiative heat transfer from the sun through the display window, heat dissipation systems of the past that attempt to cool the entire interior of the display with fins and fans are no longer adequate. On the other hand, it is to be noted that fans may also be implemented with the sealed configurations of the present invention. This may provide the advantage of adding convective heat transfer while isolating the electronic components from external dust. The present invention may be sealed to withstand pressures in a range from approximately plus 3.5 psi absolute to approximately minus 3.5 psi absolute. Sealing to this level equates to providing an enclosure that can withstand 800 pounds of force on a display window that corresponds in size to a 15 inch screen. Such sealing has the advantage of assuring that the enclosure will be protected against entry of external ambient air or moisture.

Whereas the systems of the past attempted to remove heat through all of the sides of the enclosure surrounding the electronic components, the present invention insulates the enclosure as much as possible and removes the heat via a two phase refrigerant fluid to a remote location where the heat is dissipated. For example, if a display screen is included in the electronics that must be viewed through one of the sides, then five sides will be insulated. In the case of no display, all sides (six, in the case of a hexahedron) will be insulated. Parts of any side may be insulated if a full side cannot be insulated.

One or more temperature sensors may be incorporated with the system of the present invention. One temperature sensor may be placed at an upstream end of a liquid phase line within a heat collector plate of the present invention. When this sensor detects a temperature that is too high, it sends a signal that causes the system to prevent liquid from being sent to the compressor. Another temperature sensor may be located at the compressor. The temperature sensor at the compressor may be used to detect a case in which the temperatures are below a predetermined threshold. In this case, the compressor will be turned off until the temperature in the display again requires cooling. Predetermined thresholds may be selected and the system may be configured with a thermostat to advantageously keep an interior of the enclosure at a relatively constant temperature, or at least within a range of acceptable temperatures.

Advantageously, the system associated with the present invention may be implemented as a set of components that can be implemented on existing electronic displays. In this regard, the system may include an enclosure cover for enclosing the heat collector plate in the enclosure. The system may further include internal gas and liquid phase lines inside the heat collector plate and external gas and liquid phase lines extending from the heat collector plate through or around the enclosure cover and to a compressor. The system may include a manifold and appropriate connectors for the lines. The system may include a thermally conductive mastic between the internal gas phase line and the heat collector plate. The system may also include the compressor with any number of compressor associated components. The system may include insulation between the enclosure cover and the heat collector plate, and other insulation. An insulation material may comprise any of a variety of materials including foam. The enclosure cover may likewise comprise an insulative material such an insulative ABS that is also nonflammable. The system may also include fasteners for holding the various components together and for holding the enclosure cover and heat collector plate to the electronics portion of the display. For contacting and conducting heat away from the electronics portion, the system may include a base plate. The heat collector plate may be configured to interface with a particular base plate. Alternatively, a base plate may be configured to interface with a particular electronics display and/or with a particular heat collector plate.

As may be appreciated, any number of system components may be provided as a kit for a particular display or set of displays. Thus, kits may be customized to meet particular servicing needs. For example, a kit may include one or more replacement lines. On the other hand, a kit may include, but is not limited to, any number of components including one or more of all lines, an enclosure cover, enclosure cover insulation, a heat collector plate, and a base plate.

In a simple form, a cooling system for an electronic display, may include a heat dissipater, a compressor, a liquid phase line, and a gas phase line. The system may also include a heat collector thermally connected to each of the liquid phase line and the gas line. A cover may be used to enclose the heat collector within a housing of the electronic display.

The cooling system may further include a base plate thermally coupled to the heat collector, wherein the base plate is adapted for at least one of thermal connection to an electrical component inside the housing or convective heat transfer from air inside the housing. The base plate may include fins to enhance convective heat transfer from circuitry and/or at least one recess to accommodate the electrical component.

The heat collector may be advantageously adapted to be enclosed within the housing on an inside of the cover. In this regard, the heat dissipator would be located on an outside of the cover and would not adapted to be enclosed in the housing. The liquid phase line and the gas phase line would thus traverse the cover. The cover may be adapted for connection to the housing, for enclosing a circuitry of the electronic display, and for enclosing the heat collector in a housing interior. The cover may form a thermal barrier adapted for placement between a housing interior and a housing exterior. The gas phase line and the liquid phase line may pass through the cover. Alternatively, the lines could be routed through a wall of the display housing.

The cooling system may further include insulation on an interior surface of the cover. Pins providing a position indication mechanism may be fixed to the heat collector, traverse the insulation, and extend through the cover. Fasteners may be threaded fasteners, extend through the cover and the heat collector, and engage the display in order to fix the cover on the display. The insulation may have resilient properties so that the fasteners may draw the cover closer to the heat collector and compress the insulation when the fasteners are tightened. At the same time, the position indication mechanism may indicate when the cover is in a fully closed position by a visibly changed physical relationship of the pins relative to other display structure.

The housing associated with the cooling system of the present invention may be adapted to form an enclosure together with the cover. The system may further include insulation adapted for mounting on interior surfaces of the enclosure. The insulation may be adapted to cover generally all of the interior surfaces except for a surface through which a display screen is viewed. The insulation may further be adapted to cover generally all of the interior surfaces of the enclosure.

The cooling system may further include a first sensor in a downstream end of the liquid phase line and a second sensor in a downstream end of the gas phase line to monitor and provide feedback to a thermostat in order to maintain the interior temperature in a preselected range.

The cooling system may further include a plurality of liquid phase lines including the liquid phase line referred to above and a plurality of gas phase lines including the gas phase line referred to above. The liquid phase lines and the gas phase lines may be adapted for thermal connection to a plurality of electronic displays including the electronic display referred to above. Likewise, the cooling system may include a plurality of heat collectors including the heat collector referred to above. The plurality of heat collectors may be thermally connected to respective ones of the plurality of liquid phase lines and to respective ones of the plurality of gas phase lines. The cooling system may also include a plurality of covers including the cover referred to above. The plurality of covers may be adapted for enclosing respective heat collectors of the plurality of heat collectors within a plurality of respective housings including the housing referred to above. In this case, the compressor is a common compressor for the plurality of electronic displays and the compressor is connected to the heat collectors by respective ones of the liquid phase lines, and by respective ones of the gas phase lines. A regulator may be provided in fluid communication with the compressor and the plurality of liquid phase and gas phase lines. The compressor may be located remotely relative to the plurality of heat collectors.

In another simple form of the invention, an electronic display and cooling system may include a housing holding circuitry, a heat collector inside the housing, a gas phase line and a liquid phase line, and a heat dissipater external to the housing. The heat dissipater may be thermally connected to the heat collector by the gas phase line and the liquid phase line.

A base plate may be thermally connected to the circuitry and thermally connected to the heat collector. The base plate may include a thermal conductor configured to interface with the circuitry in a predetermined manner. The circuitry may be a circuitry of a particular electronic display and the base plate may be configured to fit on the circuitry in a thermally conductive condition. The base plate may include fins to enhance convective heat transfer from the circuitry. The base plate may additionally or alternatively include at least one recess to accommodate at least one electrical component of the electronic display. The base plate may not be configured in a form commonly thought to be a plate at all, but may have any configuration that matches the electronic components and heat collector with which it is implemented.

A cover may be connected to the housing and enclose the circuitry and the heat collector in a housing interior. The cover may form a thermal barrier between the housing interior and a housing exterior. The gas phase line and the liquid phase line may traverse the cover. Alternatively, the lines could be routed through a wall of the display housing.

The display and cooling system may also include insulation on an interior surface of the cover as described with regard to the cooling system above. All the features of the cooling system described above are also applicable to the cooling system and display combination of the present invention.

The display and system may further include at least three chambers in a housing interior and a plurality of fan sets in the housing interior. Each fan set may include at least one fan. A first fan set may be positioned to circulate air from a second chamber to a first chamber and back to the second chamber. A second fan set may be positioned to circulate air from the second chamber to a third chamber and back to the second chamber. Thus, excessive heat in the housing interior may be transferred outside of the housing without exposing the circuitry in the housing to dust and moisture from outside the housing.

The at least three chambers and the plurality of fan sets may be positioned and controlled to move heat from areas of higher heat concentration in order to selectively cool overheated locations or to warm overly cool locations. A display component may be wholly inside the display housing. The display component and at least one circuit board may be positioned to at least partially define the first chamber as a front chamber, the second chamber as a center chamber, and the third chamber as a rear chamber. The front chamber may include a portion of the housing between the housing and the display component. The center chamber may include a portion of the housing between the display component and the at least one circuit board. The rear chamber may include a portion of the housing between the at least one circuit board and the housing. In this regard, a plurality of backlighting lamps may be positioned in the center chamber. Furthermore, the heat collector may be positioned in the rear chamber.

The display and system may include sensors as described above. The display and system may also be a first display and system of a plurality of displays with respective systems. Alternatively, the present invention may include a plurality of electronic displays and respective housings. On the other hand, the cooling system may have a plurality of heat collectors in the respective housings fluidly and thermally connected to a common compressor. In this regard, a plurality of liquid phase lines, a plurality of gas phase lines, and a plurality of covers may be provided as described above.

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

Embodiments of the present invention relate to a cooling system for an electronic display and to combinations of the cooling system and the electronic display. The present invention also relates to a heat collector including a heat collector plate for the cooling system.

Figure 1:
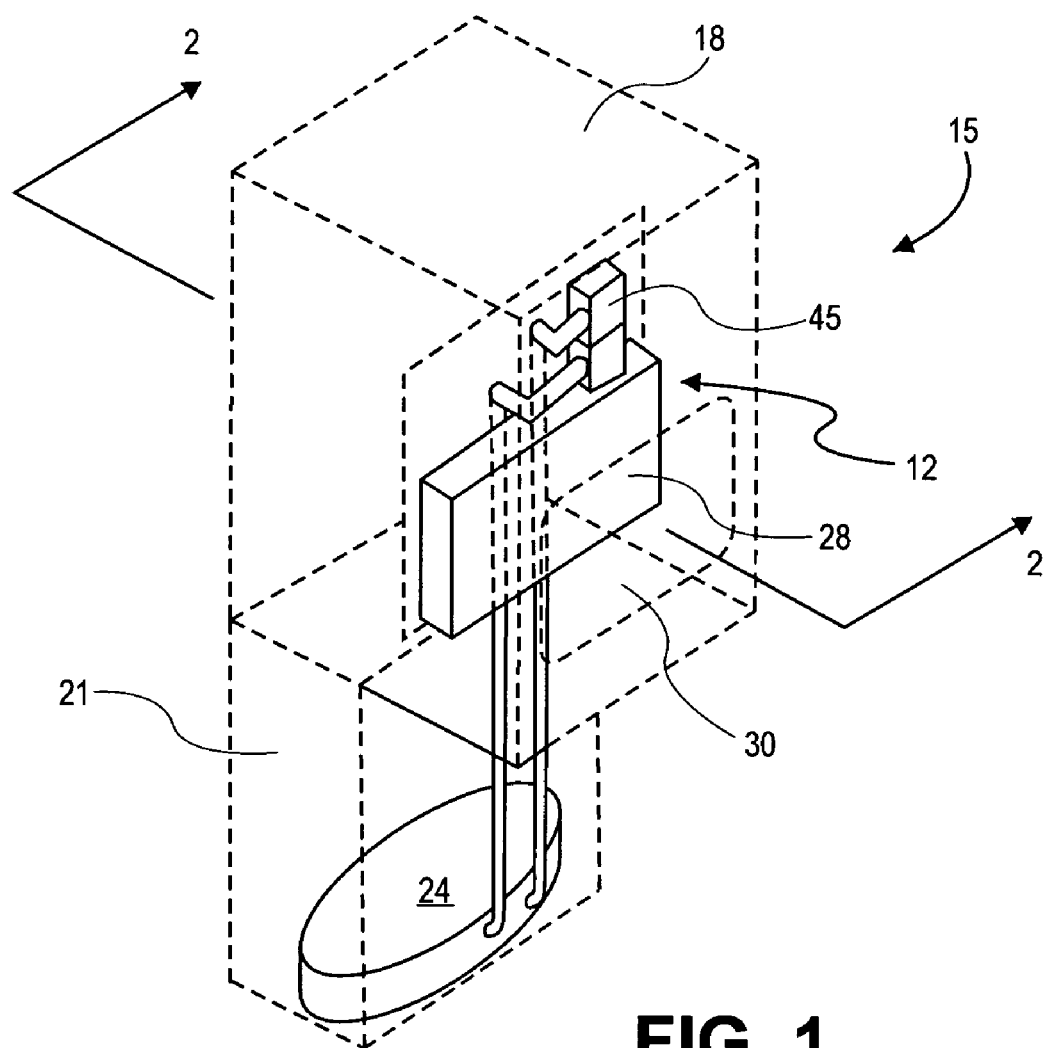
FIG. 1 is a perspective diagrammatic view showing a heat collector 12 in accordance with the present invention in conjunction with an exemplary electronic display.

As shown in FIG. 1, a heat collector 12 may be provided in a display 15 in order to collect and remove excess heat from a compartment 18 and dissipate the excess heat in a location remote from the compartment 18, such as in a housing base 21. In the exemplary view of FIG. 1, the housing base 21 contains a compressor 24. The housing base 21 will also typically include fins or other heat dissipating components and structure associated with the compressor 24.

Advantageously the compartment 18 is a thermally insulated enclosure. For example, in FIG. 2, a cross section of the display 15 taken along lines 2—2 of FIG. 1 shows an alternative embodiment including walls 25, 26, which may be formed of an insulative ABS material. Alternatively, an insulation material may be placed on interior surfaces of housing walls as will be described in greater detail relative to FIG. 6 below. The compartment 18 may be kept relatively small, and may include only the necessary components for a visual display 27 and the heat collector 12. In the exemplary embodiment of FIG. 1, the heat collector 12 includes a heat collector plate 28 in thermally conductive communication with at least one heat producing electronic component 29 of the visual display 17. Thus, most of the heat transfer from visual display components may be provided by conduction through the heat collector plate 28. Fans may also be incorporated to provide additional convective heat transfer as will be described in greater detail relative to FIG. 6.

As shown in FIG. 1, the display 15 may include a window 30 for viewing the visual display 27. The visual display 27 may be an electronic devise such as a liquid crystal display (LCD), for example. The LCD used in conjunction with the display 15 shown in FIGS. 1 and 2 may be similar to those used in laptop computers, for example, and may be positioned generally between the heat collector plate 28 and a display window 30. As may be appreciated, when the display 15 is exposed to outdoor elements, the temperatures inside the display 15 will vary greatly without some kind of cooling device. As such, the electronics including the LCD screen 27 will have a greatly reduced life span. By implementing the heat collector 12 of the present invention, temperature fluctuation is greatly reduced. The mean time before failure (MTBF) of a fifteen inch LCD with the cooling heat collector 12 of the present invention is estimated to be approximately five to approximately seven years. This is a significant increase over the MTBF of approximately eighteen months to approximately twenty-four months for a ten to twelve inch screen and the cooling systems of the past. This cooling capability and increased life expectancy has been achieved in spite of the fact that the fifteen inch screen generates more heat than the ten to twelve inch screens.

It is to be understood that the spirit and scope of the present invention includes cooling of displays including, but not limited to LCDs. By way of example and not by way of limitation, the present invention may be used with displays selected from among LCD (including TFT or STN type), light emitting diode (LED), field emitting display (FED), cathode ray tube (CRT), and plasma displays. Furthermore, the present invention may be used with displays of other types including those not yet discovered. In particular, it is contemplated that the present invention may be well suited for use with full color, flat panel LED displays.

Figure 7:
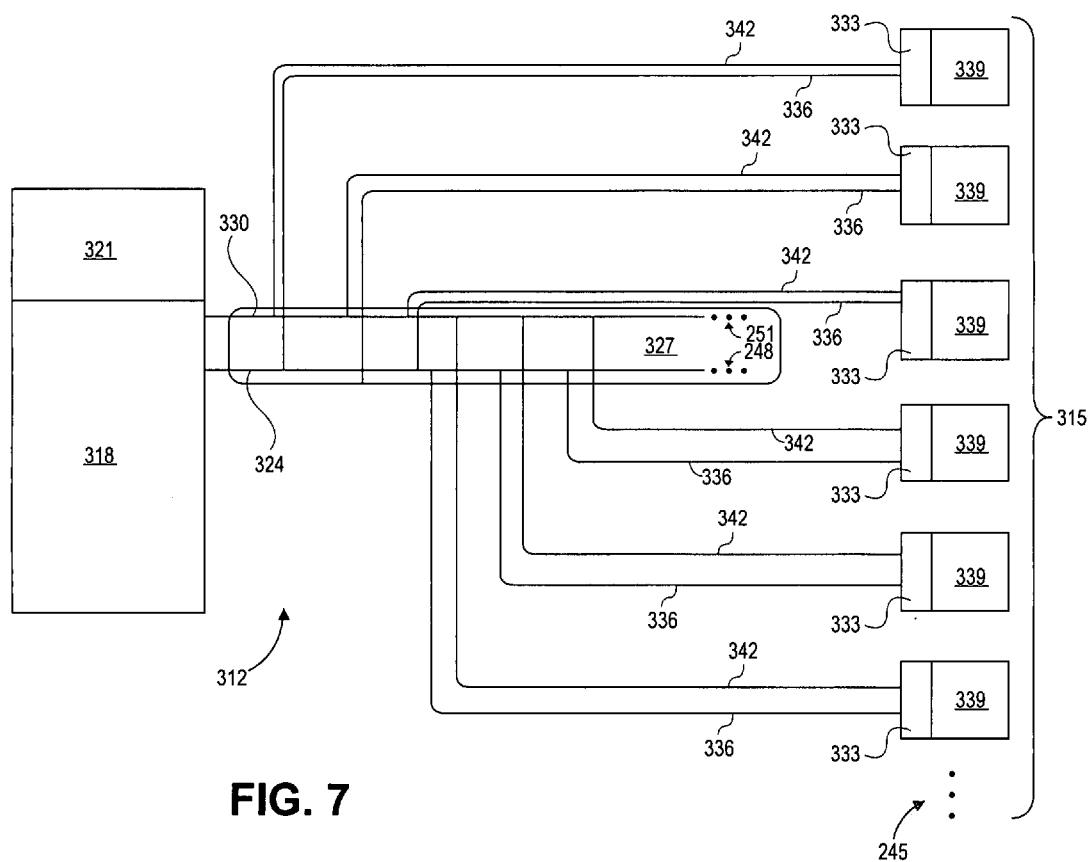
FIG. 7 is a schematic view of a cooling system for multiple electronic displays.

Another advantage of the present invention is that the heat collector 12 is thermally separated from the compressor 24. In fact, the compressor 24 may be located completely remote from the display. For example, a large common compressor could be located in a canopy or in a roof top location remote from one or more displays. This common compressor may be operatively connected to several heat collectors as shown in FIG. 7, as will be described in greater detail below.

Figure 3A:
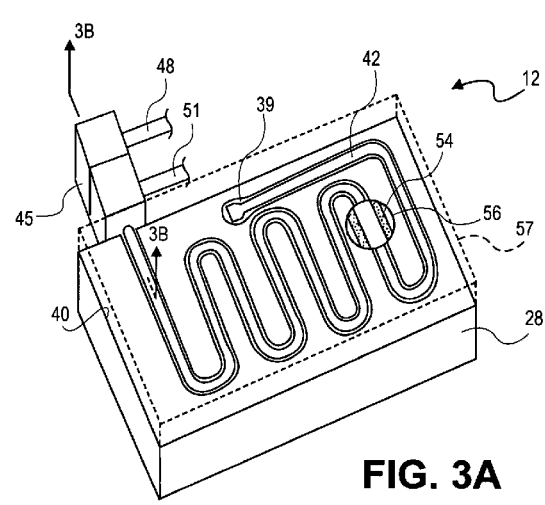
FIG. 3A is a is a perspective view of the heat collector of FIG. 1.

FIG. 3A is a perspective view of the heat collector 12. The heat collector 12 includes the heat collector plate 28 having a recess 39 in an upper surface 40 thereof for receiving a composite gas phase and liquid phase line 42 therein. The composite line 42 is connected to a manifold 45. The manifold 45 routes an external liquid phase line 48 and an external gas phase line 51 into and out of the composite line 42 respectively. A mastic 54 such as a thermal grease may be placed in the recess 39 to provide good thermal conduction between the composite line 42 and the heat collector plate 28, as shown in the zoomed view at 56. A heat collector plate cover 57 may be placed over the recess 39 and the composite line 42 in order to hold the composite line 42 in place. In an assembled state in which the cover 57 holds the composite line 42 in the recess 39, the cover 57 forms an integral part of the heat collector plate 28 and provides a uniform outer surface for the plate 28.

Figure 3B:
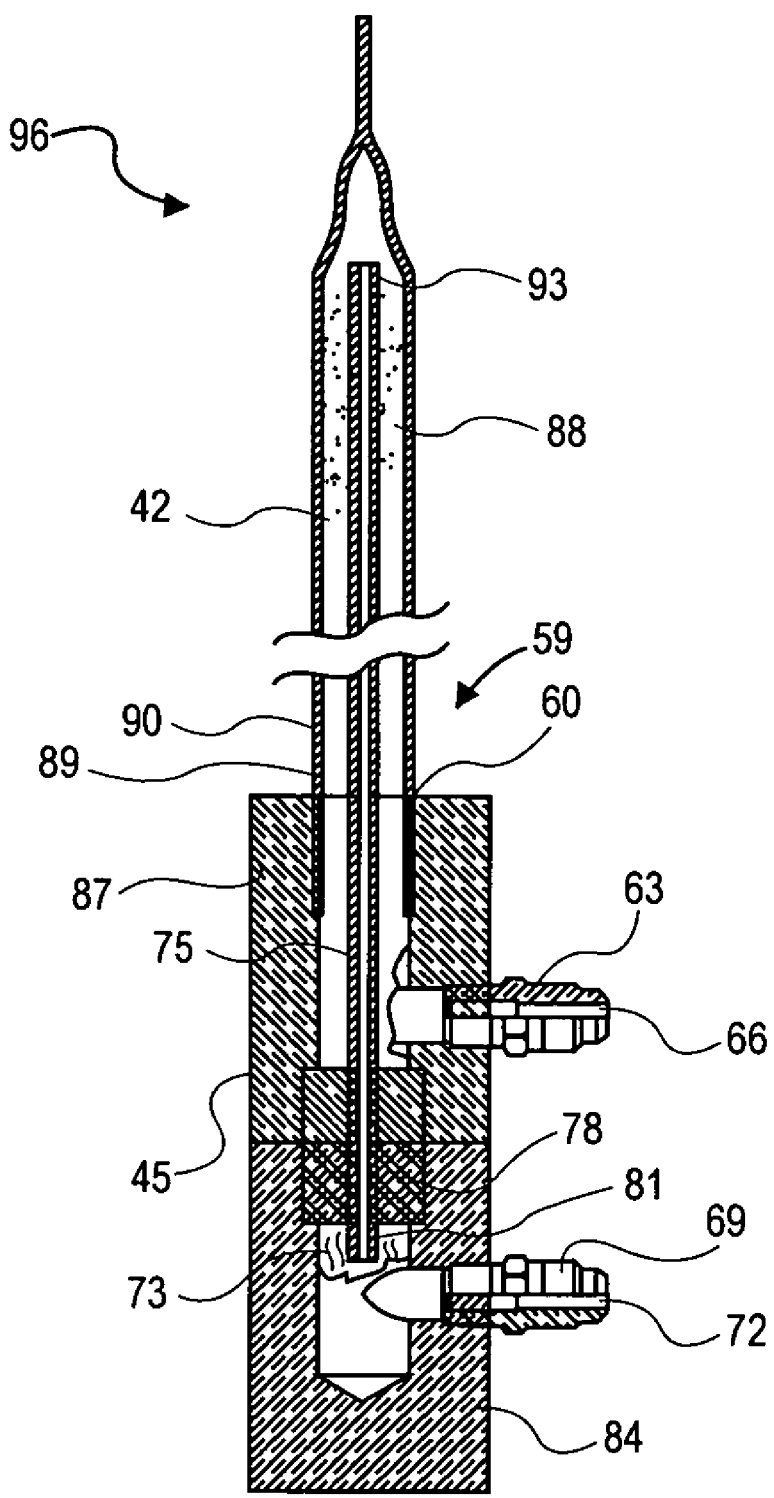
FIG. 3B is a partial sectional view of a manifold and lines taken along lines 3A—3A of FIG. 2.

FIG. 3B is a partial sectional view taken along lines 3B—3B of FIG. 3A. The manifold 45 has a combined input and output connection 59 provided by an opening 60 receiving the composite line 42 therein. The manifold 45 also has an output connection 63 that may be provided by a nipple, for example. The output connection 63 provides an output opening 66. The manifold 45 also has an input connection 69 that may be provided by another nipple, for example. The input connection 69 provides an input opening 72. The input connection 69 receives a liquid phase material 73 from an external liquid phase line and directs the liquid phase material 73 through the manifold 45 and into an internal liquid phase line 75. A plug 78 receives a first end 81 of the internal liquid phase line 75 and holds it in place within the manifold 45. The plug 78 also isolates a liquid phase input portion 84 of the manifold 45 from a gas phase output portion 87 thereof. Thus, the liquid phase material 73 flows into the input portion 84 of the manifold 45 and into the first end 81 of the internal liquid phase line 75 while a gas phase output portion of the material 88 flows generally in the opposite direction from a second end 96 of an internal gas phase line 90, back to a first end 89 of the internal gas phase line, into the gas phase portion 87 of the manifold 45, and out of the output connection 63.

As shown in FIG. 3B, the composite line 42 includes the internal gas phase line 90 and the internal liquid phase line 75 disposed inside the internal gas phase line 90. Thus, the material 73 flows into the composite line 42 via the internal liquid phase line 75. When the material 73 reaches a second end 93 of the internal liquid phase line, the material flows out of the second end 93 of the internal liquid phase line 75 and expands into a gas 88 in a second end 96 of the internal gas phase line 90.

Thus, the internal liquid phase line 75 is generally surrounded by a gas phase portion 88 of the material as it flows out of the heat collector plate 28 and the manifold 45. This arrangement has several advantages. For example, the internal liquid phase line 75 may be a copper capillary tube, which is relatively fragile. Therefore, placement of the internal liquid phase line 75 inside the internal gas phase line 90 has the advantage of protecting the internal liquid phase line 75.

Furthermore with the present invention, the liquid phase material 73 may be brought from the compressor to the manifold in an external liquid phase line 48 that is substantially the same shape and size as the external gas phase line 51. Hence, both the external gas phase line and external liquid phase line may be provided by a universal line. This configuration thus provides greater efficiency in stocking parts, and simplifies installation and replacement of the external lines. Another advantage is provided in that the liquid phase material in the internal liquid phase line 75 is cooled as it moves from the first end 81 to the second end 93 of the internal liquid phase line 75.

As can be appreciated, the assembly of the manifold 45 with the composite line 42 is facilitated by the configuration of the liquid phase input portion 84 and the gas phase output portion 87 of the manifold 45. In particular, the manifold 45 generally forms a shell with recesses in respective liquid phase and gas phase portions 84, 87 for receiving the plug 78 therein. The plug fits snugly within each of these recesses to form a sealed connection that does not permit escape of the liquid and gas phase material 73, 88. Thus, when the manifold 45 is in its assembled configuration, the plug 78 forms a barrier that prevents the material from escaping and that isolates the liquid phase material 73 from the gas phase material 88.

Figure 3C:
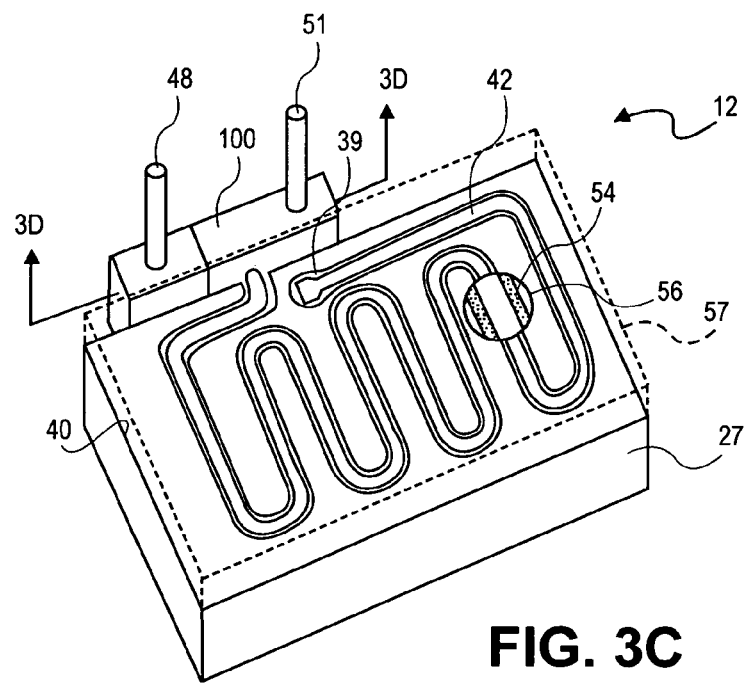
FIG. 3C is a perspective view of the heat collector having an alternative manifold thereon.

FIG. 3C is a perspective view of the heat collector 12 with an alternative embodiment of a manifold 100 thereon. The heat collector 12 includes the heat collector plate 27 having a recess 39 in an upper surface 40 thereof for receiving a composite gas phase and liquid phase line 42 therein, as described with regard to FIG. 3A above. The composite line 42 is connected to the manifold 100. The manifold 100 routes an external liquid phase line 48 and an external gas phase line 51 into and out of the composite line 42 respectively. The remaining aspects and function of the embodiment of FIG. 3C are substantially similar to those of FIG. 3A as described above.

Figure 3D:
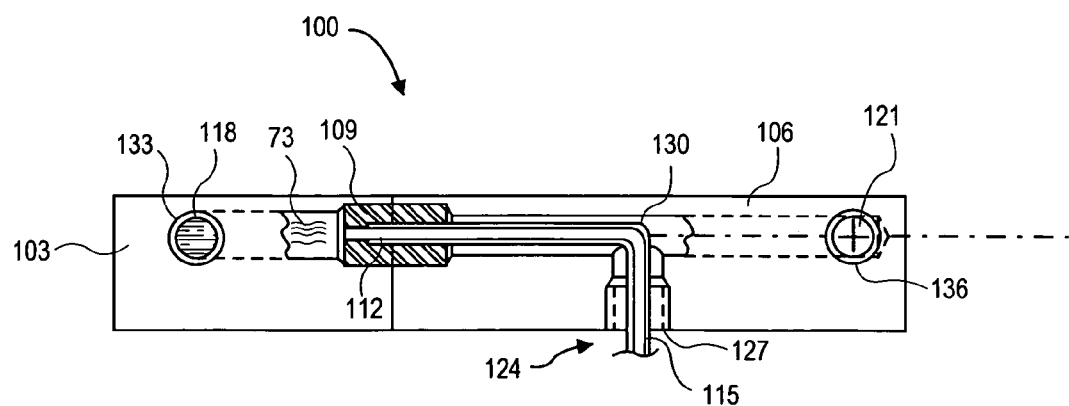
FIG. 3D is a partial sectional view taken along lines 3D—3D of FIG. 3C and showing a partial sectional view of the alternative embodiment of a manifold that may be used with the heat collector of FIGS. 1–3A and 2.

FIG. 3D shows an alternative embodiment of the manifold 100 including a liquid phase portion 103 and a gas phase portion 106. Similar to the embodiment shown and described with regard to FIG. 3A, the manifold 100 accommodates a plug 109. The plug 109 holds a first end 112 of an internal liquid phase line 115. The plug 109 also isolates a liquid phase portion 118 of material from a gas phase portion 121 of the material. In this embodiment, an input and output connection 124 for connection with a composite line is provided by an opening 127. In order to provide the internal liquid phase line 115 inside of the internal gas phase line, the internal liquid phase line 115 has a bend 130. This configuration permits an input connection 133 and an output connection 136 to lie in closer proximity to the heat collector plate 28. Otherwise, the manifold 100 functions generally similarly to the manifold 45 shown and described above with regard to FIG. 3B.

Figure 4A:
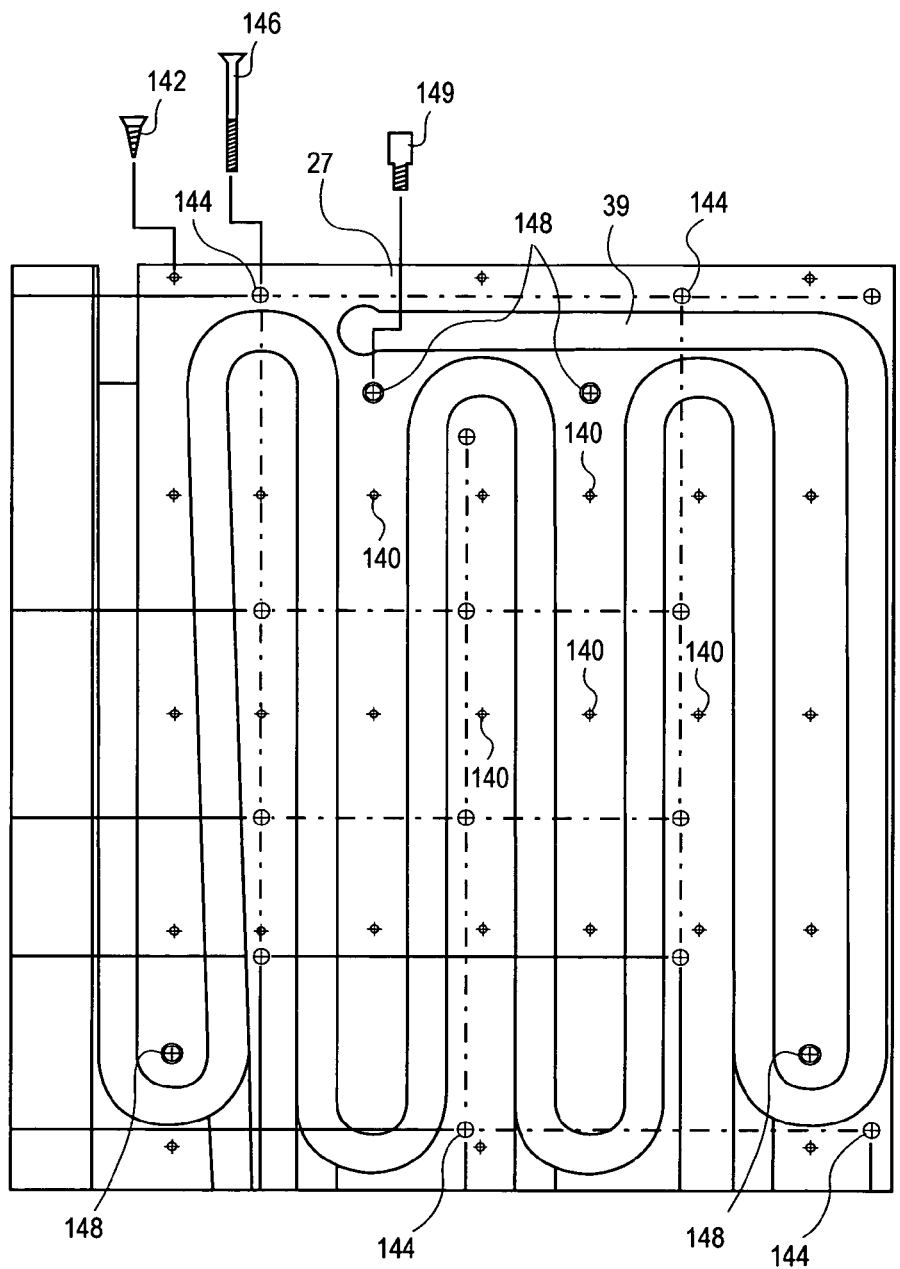
FIG. 4A is a top plan view of a heat collector plate in accordance with the present invention.

FIG. 4A is a top plan view of the heat collector plate 28 with the recess 39 formed therein. The heat collector plate 28 has first apertures 140 for receiving first fasteners 142, only one of which is shown in FIG. 4A. The first fasteners 142 attach the heat collector cover 57 to the heat collector plate 28.

Figure 2:
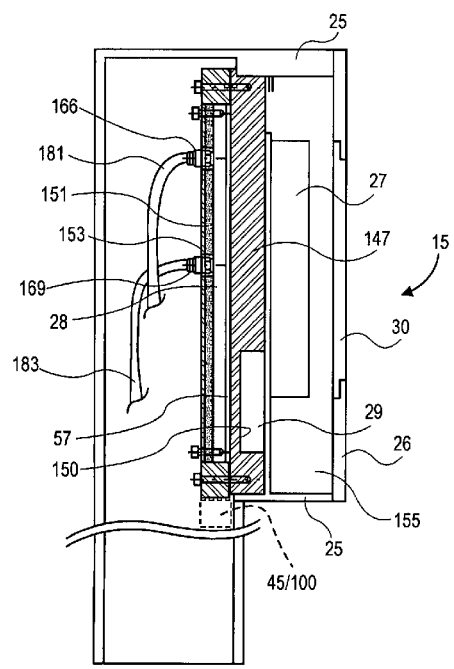
FIG. 2 is a partial sectional view of an alternative cooling system and display taken along lines 2—2 of FIG. 1.

The heat collector plate 28 has second apertures 144 for receiving second fasteners 146, only one of which is shown. The second fasteners 146 extend through the heat collector plate 28 and hold the heat collector plate 28 in a secured condition inside the display 15. To this end, the second fasteners 146 may engage in structure such as a base plate 147 as shown in FIG. 2. Thus, when the second fasteners 146 are tightened, the heat collector plate 28 is drawn into contact with the base plate 147 and provides thermally conductive contact therewith. In cases in which good thermal contact is still not achieved, a thermal mastic may be disposed between the heat collector plate 28 and the base plate 147.

The base plate 147 is to be thermally connected to the circuitry of the visual display 27 and thermally connected to the heat collector 28. The base may thus include a thermal conductor configured to interface with the circuitry in a predetermined manner. The circuitry may be a circuitry of a particular electronic display and the base may be configured to fit on the circuitry in a thermally conductive configuration. The base may include fins to enhance convective heat transfer from the circuitry. The base may additionally or alternatively include at least one recess 150 to accommodate the at least one electrical component 29 of the electronic display. The heat collector plate may be configured to interface with a particular base. Hence, it is expected that a variety of recesses and other structure will provide a varied contour that meets a particular circuitry configuration in a visual display or other electronic device. Similarly, the heat collector plate may be configured to have a contour that matches a particular base plate of a particular electronic device. Alternatively, a base may be configured to interface with a particular electronics display and with a particular heat collector plate.

The heat collector plate 28 has third apertures 148 that fixedly receive third fasteners 149 in the form of indicator pins. Only one fastener 149 is shown in FIG. 4A, although several third fasteners 149 are to be received in respective apertures 148 throughout the heat collector plate 28. The third fasteners 149 may be configured to extend away from the heat collector plate 28 far enough to protrude through insulation 151 and an enclosure cover 153 as shown in FIG. 2. The enclosure cover 153 helps to form an enclosure 155 within the compartment 18, as also shown in FIG. 2. The third fasteners 149 or position indicator pins will protrude out of the enclosure cover 153 a first distance before the second fasteners 146 are properly engaged and tightened to secure the heat collector plate 28 to the display 15. Due to its resilient nature, the insulation 151 acts as a spring that resiliently biases the enclosure cover 153 away from the heat collector plate 28. However, the insulation is compressed during tightening of the second fasteners 146 and the enclosure cover is moved a distance indicated at 157 toward the heat collector plate against the bias of the insulation as shown in FIG. 4B.

Figure 4B:
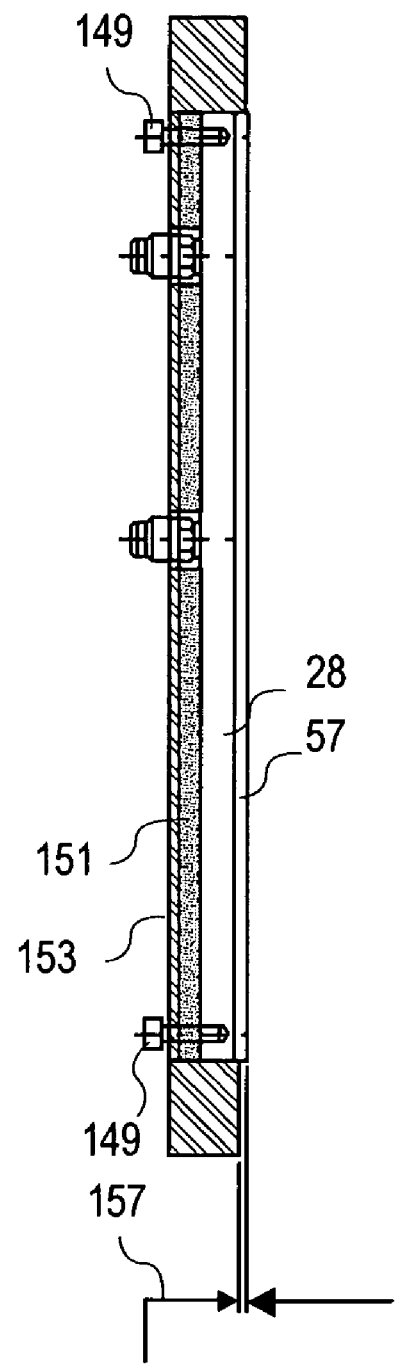
FIG. 4B is a sectional view similar to FIG. 2 and showing the insulation in an expanded state.

FIG. 4B is a sectional view of the enclosure cover 153, insulation 151, and the heat collector plate 28 as a unit. As may be appreciated, the cover 153 may be held to the heat collector plate 28 by the third fasteners 149 having larger heads. This sectional view is similar to that of FIG. 2. However, the enclosure cover 153 is not attached to the base plate 147 by the second fasteners 146. Therefore, the insulation 151 is in its expanded state. After the second fasteners 146 have been properly seated and tightened sufficiently, the position indicating pins 149 will protrude out of the enclosure cover 153 to a second distance shown in FIG. 2 greater than the first distance shown in FIG. 4B. Thus, the third fasteners 149 extend in an extended position to the second distance and indicate that the second fasteners 146 are properly engaged and sufficiently tightened. In this way, the second and third fasteners 146, 149 work together to provide a position indicator mechanism that advantageously enables a user to determine whether the heat collector plate 28 has been properly installed.

As shown in FIG. 4A, it is to be understood that a large number of first apertures 140 and corresponding first fasteners 142 are needed in order to assure that the cover 57 holds the composite line 42 in the recess 39 throughout an entire length of the recess 39. Furthermore, the first fasteners 142 ensure that the composite line 42 is held in thermal communication with any thermal mastic in the recess 39. Thus, proper thermal conduction between the composite line 42 and the heat collector plate 28 is assured by the large number of first apertures 140 and fasteners 142. Another requirement is that the cover 57 (shown in FIGS. 2, 3A, and 4B) needs to be thick enough to prevent warping or bending of the cover 57 away from the recess 39 and the line 42 therein. Thus, the cover 57 may comprise a metal plate that has a thickness of approximately ⅛ inch or greater. The cover 57 may be formed of another material. However, the cover needs to have good heat conduction characteristics when disposed in contact with the base plate 147 as shown in FIGS. 2 and 4B. Likewise, a large number of second apertures 144 and second fasteners 146 is required to assure that the heat collector plate 28 is held in good thermal contact with the base plate 147 and/or other elements within the display 15. Thus, an exceedingly tight, efficient, and effective heat collector may be provided.

FIG. 2 is not a precise sectional view of the embodiment shown in FIG. 1. In particular, the heat collector plate 28 shown in FIG. 1 does not extend as high or as low as does that shown in FIG. 2. Furthermore, the manifold 45 of FIG. 1 is not shown in FIG. 2. Rather, an input connection 166 and an output connection 169 are connected directly to the heat collector plate 28 for connection with an external liquid phase line 181 and an external gas phase line 183 respectively, as shown in FIG. 2. As may be appreciated from the description of FIGS. 3B and 3D above, a manifold for connection with the heat collector plate 28 of the present invention may take any one of a variety of forms. Furthermore, a manifold may be integrally formed in the heat collector plate so that an input line 181 and an output line 183 are combined into a composite line inside the heat collector plate. In this way, additional parts would not be required in order to provide isolation of the liquid and gas phases from each other. Alternatively, isolation of the phases, in a manifold formed integrally with the heat collector plate 28, may be provided by a plug similar to those shown in FIGS. 3A and 3b, for example.

It is to be understood that many aspects of the present invention are still upheld with an external capillary input line and a solely gas phase internal line with separate input and output connections directly connected to the heat collector plate. Still further, a composite internal line with separate inlet and outlet opening in the heat collector plate may have a transition at an intermediate position along the composite internal line so that an upstream portion forms an internal liquid phase line and a downstream portion forms an internal gas phase line.

It is also to be noted that the sectional view of FIG. 2 may represent the heat collector plate with a manifold like manifold 100 of FIG. 3D attached along a hidden side thereof. In fact, the embodiments of FIGS. 1 and 2 are not intended to be restrictive in any manner. Rather, the heat collector plate may be provided of any height or width to accommodate any configuration of the manifold within the enclosure cover 153. Furthermore, the manifold 45/100 could be provided outside the enclosure cover 153, yet inside the walls 25 of the display 15, as shown in dashed lines in FIG. 2. Still further, the manifold 45/100 could be located outside the display 15 altogether, as shown and described with regard to FIG. 6 below.

Figure 5:
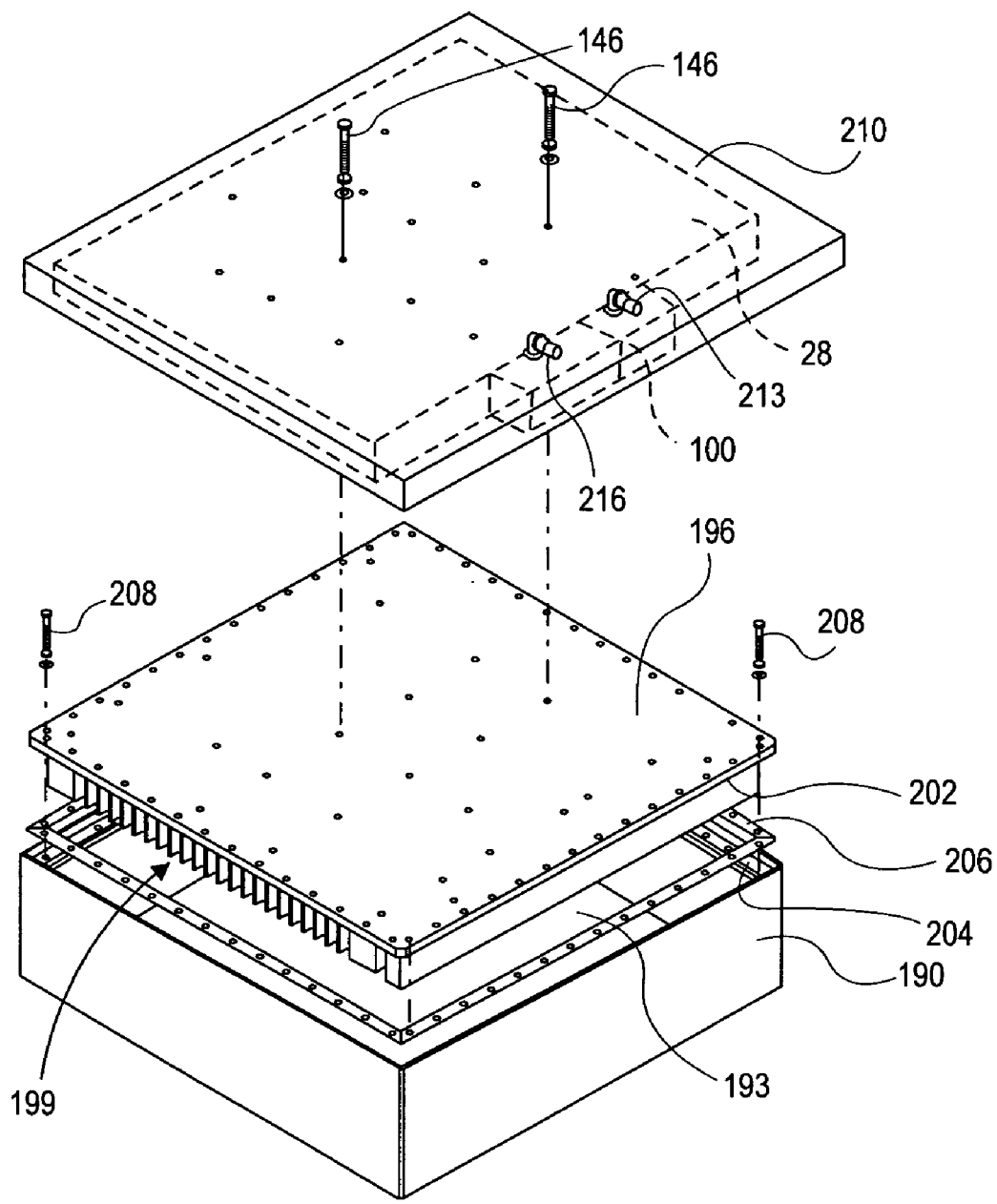
FIG. 5 is an exploded perspective view of an alternative housing, base plate, and a composite heat collector and housing cover.

FIG. 5 is an exploded perspective view of an alternative embodiment of an electronic display housing 190 for supporting display electronics in an enclosure 193. A base plate 196 is configured to connect with the electronics in a thermally conductive manner. The base plate 196 may also include fins 199 to aid in convective heat transfer from the electronic components to the base plate 196. The electronic components may be mounted to an underside of the base plate 196. Thus, the base plate and electronic components may be inserted in the housing 190 as a unit. As shown in the exemplary embodiment of FIG. 5, a lip 202 is formed around an outer periphery of the base plate 196. This lip 202 is configured to be supported on a shoulder 204 on an interior of the housing 190. A gasket 206 may be placed between the lip 202 and the shoulder 204 in order to provide insulation and/or sealing of the enclosure 193. That is, the gasket 206 may be provided in order to insulate components within the enclosure 193 from the housing 190 and an exterior thereof. Furthermore, the gasket 206 prevents air and other fluids from entering the enclosure 193 from outside the housing 190.

Fasteners 208 may be provided in order to hold the base plate 196 in position on the housing 190. A housing cover 210 is also an enclosure cover in this embodiment. A heat collector plate 28 may be held on an underside of the housing cover 210 by position indicator fasteners similar to fasteners 149 shown in FIG. 4A. Such fasteners may work together with fasteners 146 to provide a position indicating mechanism similar to that described above. The heat collector plate 28 has a manifold 100 associated therewith similar to that shown in FIG. 3D. The manifold 100 may have an input connection 213 and an output connection 216 connected thereto. The input and output connections 213, 216 receive external liquid phase and gas phase lines respectively, as described with regard to the embodiments set forth above.

It is to be understood that the housing cover 210 may have insulation on an interior surface thereof between the housing cover 210 and the heat collector plate 28 as described with regard to the embodiment of FIG. 2 above. In any case, when the housing cover 210 is properly mounted on the housing 190, the housing cover 210 and the housing 190 form a uniform electronic display housing with substantially continuous sidewall surfaces. As with the embodiments set forth above the heat collector plate 28 is in direct contact with the base plate 196. Both the base plate 196 and the heat collector plate 28 may be formed of a heat conductive material. Therefore, heat may be conducted away from the enclosure 193, and the heat producing electronic components therein, and into the two phase refrigerant material as described above.

Figure 6:
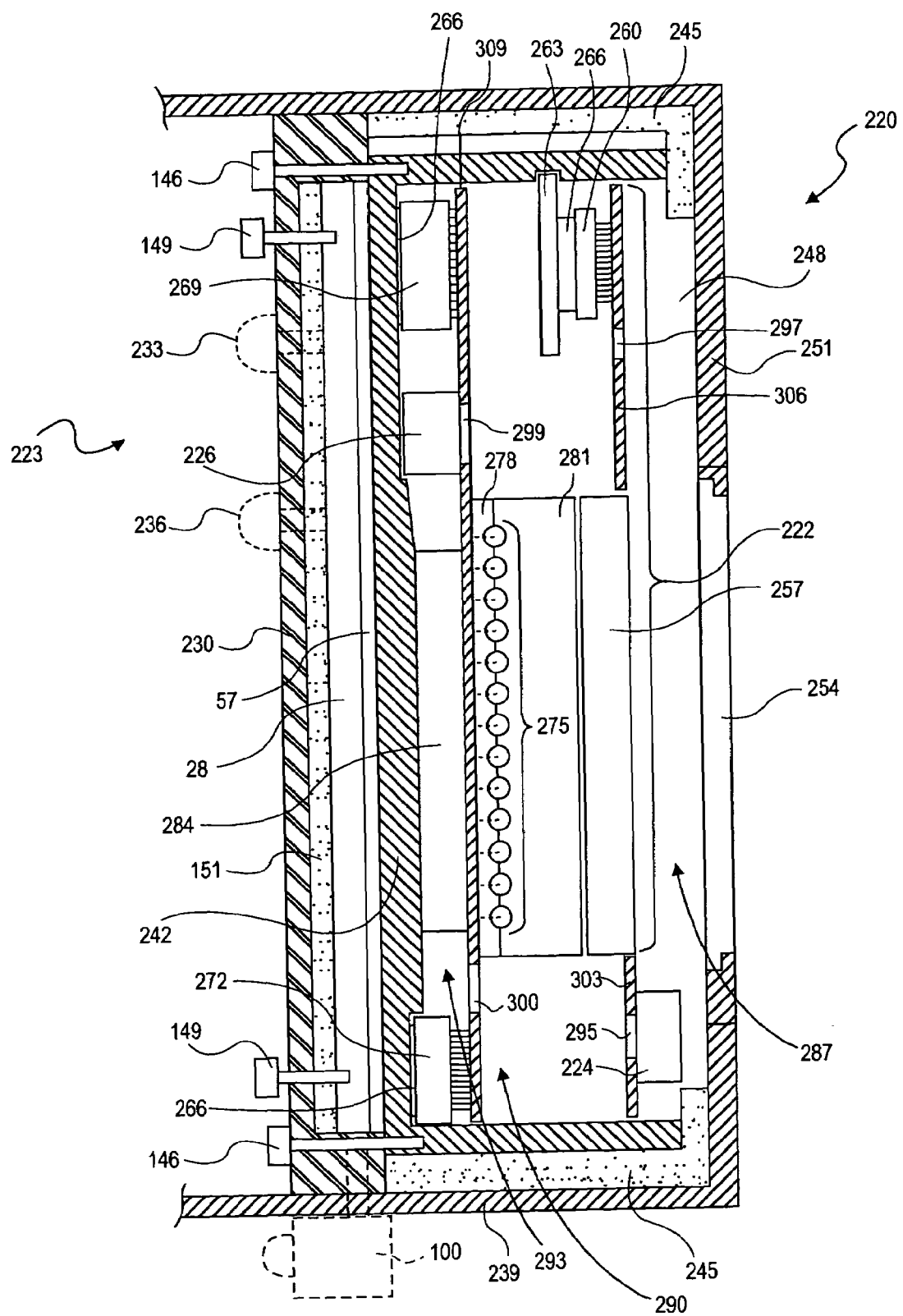
FIG. 6 is a sectional view similar to FIG. 2 showing an alternative embodiment of the cooling system and a display having three chambers.

FIG. 6 is a cross-sectional view similar to that shown in FIG. 2. A housing 220 for supporting an electronic display 222, as shown in FIG. 6, incorporates a cooling system 223 similar to those described with regard to the embodiments of FIGS. 1–5 above. However, the cooling system 223 further includes fans 224, 226 for active convective heat transfer. The cooling system 223 of FIG. 6 is analogous to those described above. For example, a heat collector plate 28 may be held to an enclosure cover 230 by position indicating fasteners 149. Insulation 151 is disposed between the enclosure cover 230 and the heat collector plate 28. Refrigerant material is circulated through the heat collector plate 28 via input and output connections 233 and 236 that may or may not enter directly into the heat collector plate 28. These connections may guide the refrigerant material through a manifold 100/45, as described above. An alternative position for a manifold 100 is shown outside a lower wall 239 of the housing 220. In this configuration, lines to the heat collector plate 28 can advantageously be changed or repaired without opening the housing 220.

The enclosure cover 230 and heat collector plate 28 combination is connected to the electronics display via the base plate 242. The heat collector plate 28 is held in thermally conductive contact with the base plate 242 by fasteners 146 in a manner substantially similar to that described above.

FIG. 6 shows additional insulation 245 on interior walls of an enclosure 248 formed by the housing 220 and the enclosure cover 230. As may be appreciated, insulation 245 may extend over generally all of the interior surfaces of the enclosure including an interior surface of a front wall 251 except in an area of a display window 254. Thus, the enclosure 248 may be substantially completely thermally isolated from ambient conditions outside of the housing 220. Thus, a visual display 257 such, as an LCD, and associated electronic components 260 may be protected from the high and low temperature extremes of the ambient air outside of the housing 220. Furthermore, the cooling system can be associated with sensors and a thermostat to maintain the enclosure 248 within a predetermined range of temperatures. This range of temperatures may be set to vary minimally in order to protect the electronic components 260 and the visual display 257 and extend their lives.

As shown, a conductive element 263 and a conductive mastic 266 are provided to thermally connect the electronic components 260 to the base plate 242. A similar thermal connection could be provided between a visual display 257 and the base plate 242. Power supplies 269 and 272 also generate heat. Thus, these electrical components need to be thermally connected to the base plate 242 as well. If needed, a thermal mastic 266 may be used to provide a conductive connection therebetween. A bank of back lights 275 may be used to increase the brightness of the visual display 257. These back lights 275 also generate heat. In order to transfer heat generated by the back lights 275, heat conductive brackets 278, 281 and fins 284 may be used.

In the embodiment shown in FIG. 6, three general chambers are provided in order to enable selective convective heat transfer in accordance with the teachings of the Applicant's own invention shown and described in U.S. Pat. No. 5,991,153. In accordance with the teachings of U.S. Pat. No. 5,991,153, a front chamber 287, a middle chamber 290, and a rear chamber 293 are provided. A front fan 224 and a rear fan 226 selectively circulate air within the enclosure 248 through openings 295, 297, 299 and 300 in circuit boards 303, 306, and 309. The different combinations of fan actuation and varying flow patterns within the enclosure 248 are shown and described in U.S. Pat. No. 5,991,153, which is incorporated herein by reference.

While heat transfer substantially completely by conductive configurations as shown and described with regard to FIGS. 1–5 is generally sufficient to maintain the display electronics within an acceptable predetermined range of temperatures, some display electronics may benefit from including the fans and active convective heat transfer shown and described with regard to FIG. 6. Several advantages and specifically beneficial flow patterns are described in the Applicant's patent referred to above.

FIG. 7 is a diagrammatic view of a cooling system 312 in combination with a plurality of electronic displays 315. In this embodiment, a compressor 318 having an associated heat dissipater 321 compresses and delivers liquid phase refrigerant in a first common line 324 to a regulator 327. The compressor 318 also receives a gas phase refrigerant in a second common line 330. The regulator 327 delivers liquid phase refrigerant to a plurality of heat collectors 333 via respective external liquid phase lines 336. The heat collectors 333 absorb heat from individual electronic displays 339 in accordance with the disclosures set forth above. Hence, the liquid phase refrigerant is converted into a gas phase and returned in respective external gas phase lines 342 to the compressor 318. In most cases, the gas phase refrigerant flow need not be regulated. As indicated by the ellipse at 245, 248 and 251, the number of displays may be increased to any practical limit. For example, in a gas station application, a single compressor 318 may be used in conjunction with twelve to eighteen or more displays 339, for example. As may be appreciated, the compressor 318 and the regulator 327 could be located in a roof or canopy that covers multiple gasoline pumps. In this way, the compressor and its associated contactor may be isolated from dangerous gas fumes. In this way, the life of electronic displays at gas pumps can be extended while the cooling system 312 is safe and meets governmental standards for gas stations.

Advantageously, using one compressor in combination with several displays reduces costs associated with multiple compressors that otherwise would be required. Furthermore, the safety requirements of forming a barrier or locating the compressors at a safe distance from the displays is greatly simplified when a single compressor is connected to multiple electronic displays for cooling purposes, such as in gas pump displays, for example.

An advantage of locating the heat dissipation components, including compressor(s), away from the location(s) at which the heat is collected, is that heat transfer back into the compartment 18 by conduction and/or convection is greatly reduced. Also, the volume to be cooled may also be greatly reduced with the present invention. Therefore, the heat collector 12 of the present invention is much more efficient and effective in removing heat from the electronic components in one or more display(s) than devices of the past.

It is to be understood that the liquid phase and gas phase lines of the present invention may be formed in any variety of ways including providing preformed lines as has been shown and described above, machining the line(s) directly into the heat collector plate, or molding the plate 27 to include one or more lines as has been shown and described. The heat collector plate may be formed of any of the variety of materials including, but not limited to, aluminum. For example, there are many plastics which have good heat conductive properties that may be used to form heat collector plates in accordance with the present invention. The heat collector plate may comprise a plurality of components held together by screw or adhesives. Alternatively, the heat collector plate may be molded as a single piece. The two phase material may be any of a variety of refrigerant fluids known or not yet discovered.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A cooling system for an electronic display, the system comprising:
   a heat dissipater, a compressor, a liquid phase line, and a gas phase line;
   a heat collector thermally connected to each of the liquid phase line and the gas line;
   a cover for enclosing the heat collector within a housing of the electronic display;
   insulation on an interior surface of the cover;
   pins fixed to the heat collector traversing the insulation, and extending through the cover; and
   fasteners extending through the cover and the heat collector, the fasteners adapted for engaging the display to fix the cover on the display.

2. The cooling system of claim 1, further comprising a base thermally coupled to the heat collector, wherein the base is adapted for at least one of thermal connection to an electrical component inside the housing or convective heat transfer from air inside the housing.

3. The cooling system of claim 2, wherein the base comprises:
   fins to enhance convective heat transfer from circuitry; and
   at least one recess to accommodate the electrical component.

4. The cooling system of claim 1, wherein:
   the heat collector is adapted to be enclosed within the housing on an inside of the cover;
   the heat dissipator is on an outside of the cover and is not adapted to be enclosed in the housing; and
   the liquid phase line and the gas phase line traverse the cover.

5. The cooling system of claim 1, wherein:
   the cover is adapted for connection to the housing, for enclosing a circuitry of the electronic display, and for enclosing the heat collector in a housing interior, the cover forming a thermal barrier adapted for placement between a housing interior and a housing exterior; and
   the gas phase line and the liquid phase line pass through the cover.

6. The cooling system of claim 1, wherein:
   the pins have a position indication mechanism;
   the insulation has resilient properties;
   the fasteners are threaded fasteners;
   the fasteners draw the cover closer to the heat collector and compress the insulation when the fasteners are tightened; and
   the position indication mechanism indicates when the cover is in a fully closed position by a visibly changed physical relationship of the pins relative to other display structure.

7. The cooling system of claim 1, wherein the housing is adapted to form an enclosure together with the cover, the cooling system further comprising insulation adapted for mounting on interior surfaces of the enclosure.

8. The cooling system of claim 7, wherein the insulation is adapted to cover generally all of the interior surfaces except for a surface through which a display screen is viewed.

9. The cooling system of claim 7, wherein the insulation is adapted to cover generally all of the interior surfaces of the enclosure.

10. The cooling system of claim 1, further comprising a first sensor in a downstream end of the liquid phase line.

11. The cooling system of claim 10, further comprising a second sensor in a downstream end of the gas phase line.

12. The cooling system of claim 1, further comprising:
   a plurality of liquid phase lines including said liquid phase line and a plurality of gas phase lines including said gas phase line, the liquid phase lines and the gas phase lines adapted for thermal connection to a plurality of electronic displays including said electronic display;
   a plurality of heat collectors including said heat collector, the plurality of heat collectors thermally connected to respective ones of the plurality of liquid phase lines and to respective ones of the plurality of gas phase lines; and
   a plurality of covers including said cover, the plurality of covers adapted for enclosing respective heat collectors of the plurality of heat collectors within housings including said housing of respective ones of said electronic displays;
   wherein the compressor is a common compressor for said plurality of electronic displays and the compressor is connected to the heat collectors by respective ones of the liquid phase lines, and by respective ones of the gas phase lines.

13. The cooling system of claim 12, further comprising a regulator in fluid communication with the compressor and the plurality of liquid phase and gas phase lines, wherein at least the compressor is located remotely relative to the plurality of heat collectors.

14. An electronic display and cooling system, comprising:
   a housing holding circuitry;
   a heat collector inside the housing;
   a gas phase line and a liquid phase line;
   a heat dissipater external to the housing, the heat dissipater thermally connected to the heat collector by the gas phase line and the liquid phase line;
   a cover connected to the housing and enclosing the circuitry and the heat collector in a housing interior, the cover forming a thermal barrier between the housing interior and a housing exterior, wherein the gas phase line and the liquid phase line traverse the cover;
   insulation on an interior surface of the cover;
   pins fixed to the heat collector traversing a plane of the insulation, and extending through the cover; and
   fasteners extending through the cover and the heat collector, the fasteners engaging the electronic display to fix the cover on the electronic display.

15. The display and system of claim 14, further comprising a base thermally connected to the circuitry and thermally connected to the heat collector.

16. The display and system of claim 14, wherein the base comprises a thermal conductor configured to interface with the circuitry in a predetermined manner, wherein the circuitry is a circuitry of a particular electronic display and the base is configured to fit on the circuitry in a thermally conductive condition.

17. The display and system of claim 16, wherein the base comprises:
fins to enhance convective heat transfer from the circuitry; and
at least one recess to accommodate at least one electrical component of the electronic display.

18. The display and system of claim 14, wherein;
the pins have a position indication mechanism;
the insulation has resilient properties;
the fasteners are threaded fasteners;
the fasteners draw the cover closer to the heat collector and compress the insulation when the fasteners are tightened; and
the position indication mechanism indicates when the cover is in a fully closed position by a visibly changed physical relationship of the pins to other display structure.

19. The display and system of claim 14, wherein the housing and the cover form an enclosure, the display further comprising insulation on interior surfaces of the enclosure.

20. The display and system of claim 19, wherein the insulation covers generally all of the interior surfaces except for a surface through which a display screen is viewed.

21. The display and system of claim 20, wherein:
the enclosure comprises six generally flat sides; and
the insulation covers five of the six sides.

22. The display and system of claim 19, wherein the insulation covers generally all of the interior surfaces of the enclosure.

23. The display and system of claim 14, further comprising:
at least three chambers in a housing interior; and
a plurality of fan sets in the housing interior, each fan set comprising at least one fan, wherein a first fan set is positioned to circulate air from a second chamber to a first chamber and back to the second chamber, wherein a second fan set is positioned to circulate air from the second chamber to a third chamber and back to the second chamber, and wherein excessive heat in the housing interior is transferred outside of the housing without exposing the circuitry in the housing to dust and moisture from outside the housing.

24. The display and system of claim 23, wherein the at least three chambers and the plurality of fan sets are positioned and controlled to move heat from areas of higher heat concentration to selectively cool overheated locations or to warm overly cool locations.

25. The display and system of claim 23, wherein a display component is wholly inside the display housing, wherein the at least three chambers comprise three chambers, and wherein the display component and at least one circuit board are positioned to at least partially define the first chamber as a front chamber, the second chamber as a center chamber, and the third chamber as a rear chamber.

26. The display and system of claim 25, wherein:
the front chamber comprises a portion of the housing between the housing and the display component;
the center chamber comprises a portion of the housing between the display component and the at least one circuit board; and
the rear chamber comprises a portion of the housing between the at least one circuit board and the housing.

27. The display and system of claim 25, wherein the plurality of backlighting lamps are positioned in the center chamber.

28. The display and system of claim 25, wherein the heat collector is positioned in the rear chamber.

29. The display and system of claim 14, further comprising a first sensor in a downstream end of the liquid phase line.

30. The display and system of claim 29, further comprising a second sensor in a downstream end of the gas phase line.

31. The display and system of claim 14, further comprising:
a plurality of liquid phase lines including said liquid phase line and a plurality of gas phase lines including said gas phase line, the plurality of liquid phase lines and the plurality of gas phase lines thermally connected to a respective plurality of electronic displays including said electronic display;
a plurality of heat collectors including said heat collector, the plurality of heat collectors thermally connected to respective ones of the plurality of liquid phase lines and to respective ones of the plurality of gas phase lines; and
a plurality of covers including said cover, the plurality of covers enclosing respective heat collectors of said plurality of heat collectors within a plurality of housings including said housing, the plurality of housings forming enclosures of respective ones of said electronic displays;
wherein the compressor is a common compressor for said plurality of electronic displays and the compressor is connected to the heat collectors by respective ones of the liquid phase lines, and by respective ones of the gas phase lines.

32. The display and system of claim 31, further comprising a regulator in fluid communication with the compressor and the plurality of liquid phase and gas phase lines, wherein at least the compressor is located remotely relative to the plurality of heat collectors.

* * * * *